United States Patent [19]

Abdi

[11] Patent Number: 4,996,448
[45] Date of Patent: Feb. 26, 1991

[54] LOW POWER PEAK DETECTOR/BUFFER WITH FAST CHARGE-UP TIME

[75] Inventor: Behrooz L. Abdi, Chandler, Ariz.

[73] Assignee: Motorola, Inc., Schaumburg, Ill.

[21] Appl. No.: 442,272

[22] Filed: Nov. 27, 1989

[51] Int. Cl.[5] ............................................. H03K 5/153
[52] U.S. Cl. ..................................... 307/351; 307/359; 307/546
[58] Field of Search ............... 307/351, 353, 359, 540, 307/546, 494; 328/115, 151

[56] References Cited

U.S. PATENT DOCUMENTS

| | | | |
|---|---|---|---|
| 3,643,110 | 2/1972 | Thompson | 307/353 |
| 4,533,844 | 8/1985 | Miller et al. | 307/351 |
| 4,603,299 | 7/1986 | Monett | 307/351 |
| 4,720,643 | 1/1988 | Embree et al. | 307/351 |

FOREIGN PATENT DOCUMENTS

0131072  6/1988  Japan .................................... 307/351

OTHER PUBLICATIONS

N. D. Nguyen, "Simple Peak Detector", IBM Technical Disclosure Bulletin, vol. 27, No. 2, Jul. 1984, pp. 1368–1369.

*Primary Examiner*—John Zazworsky
*Attorney, Agent, or Firm*—Michael D. Bingham

[57] ABSTRACT

A peak detector circuit that provides a signal at an output terminal which represents the most positive peak voltage level applied at an input terminal. Comparator circuit is coupled to the input terminal and to the output terminal to determine which voltage signal thereof is more positive to provide an output current whenever the supplied input voltage exceeds the voltage at the output terminal. The output current is then amplified for providing a current to a capacitor circuit for developing a voltage across the capacitor equal to the positive peak voltage level applied at the input terminal. A buffer circuit coupled to the capacitor circuit transforms the voltage across capacitor circuit to the output terminal and includes a clamping circuit for clamping coupled between the output terminal and the comparator circuit to prevent the comparator circuit output from saturating whenever the voltage applied at the input terminal is less than that appearing at the output terminal.

8 Claims, 1 Drawing Sheet

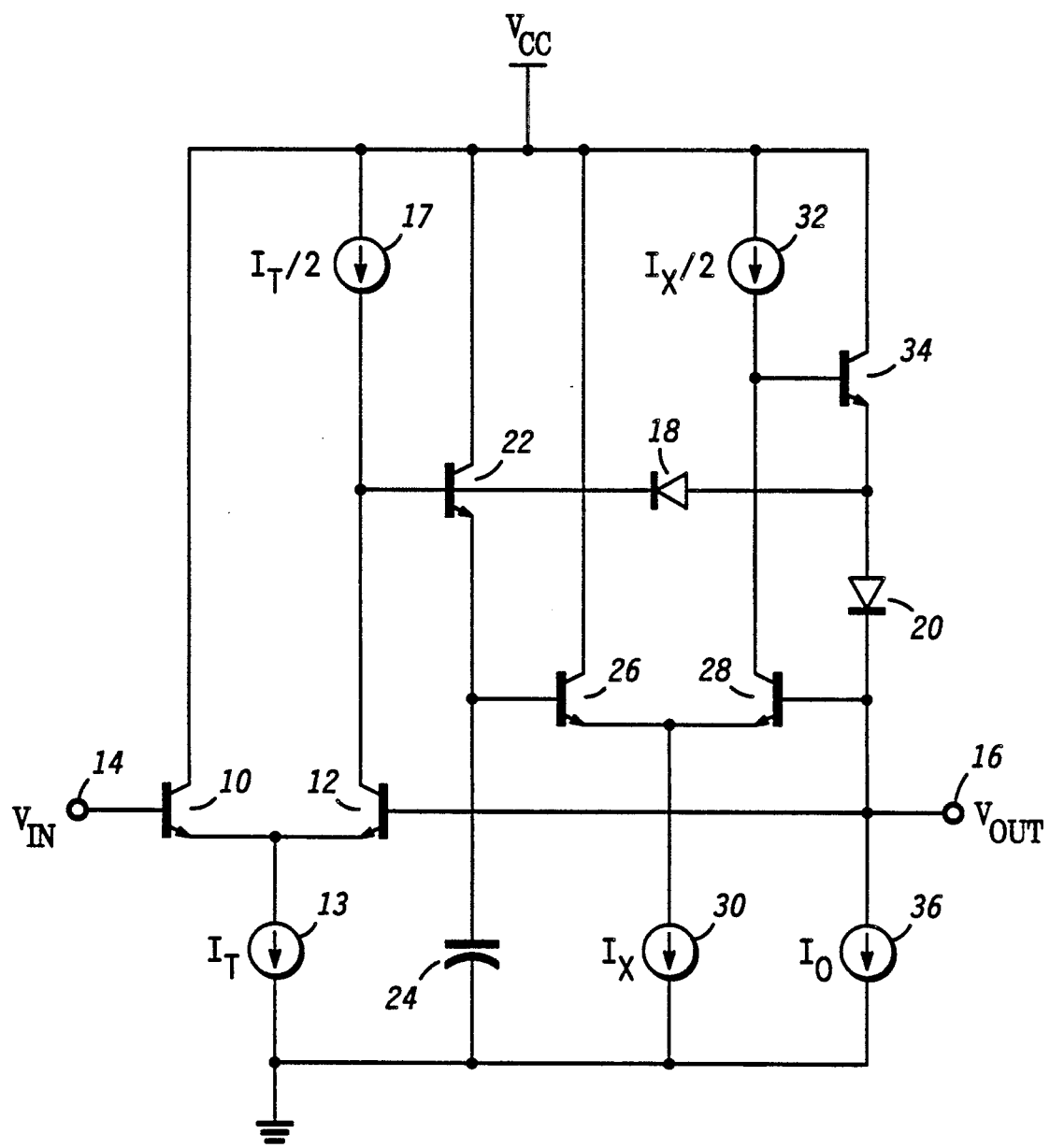

LOW POWER PEAK DETECTOR/BUFFER WITH FAST CHARGE-UP TIME

BACKGROUND OF THE INVENTION

The present invention relates to peak detectors and, more particularly, to a circuit and method for detecting the most positive peak level of a signal.

Peak detectors are usually used to track the most positive peak voltage level of a signal. Thus, the desired output of a peak detector typically represents the most positive peak voltage level of its input signal. However, most, if not all, prior art peak detectors are designed to detect the most negative peak voltage level of an input signal thereby constituting a need for inverters to implement a peak detector that detects positive peak voltage levels whereby the use of inverters creates additional offset errors.

The basic theory of a peak detector is to compare the input voltage level to the output voltage level to determine if the input signal has reached a new peak voltage level. If indeed the input signal has reached a new peak, the peak detector will respond in a manner to increase the voltage level of the output signal until it has attained the same voltage of the peak input signal. A common technique use by most peak detectors is a charge up a capacitor wherein the voltage across the capacitor represents the peak voltage level of the input signal so that when the input voltage falls below the output voltage, the capacitor maintains the peak input voltage level at the output of the peak detector.

Peak detectors can be evaluated with respect to attack time and power dissipation. Attack time is defined as the finite time required by a peak detector to adjust its output voltage level in accordance to a new peak voltage level occurring in the input signal. Attack time is dependent upon two main factors: the ability to prevent the switching transistors from entering saturation wherein the switching transistors compare the input voltage level to the output voltage level, and the speed at which the capacitor in the peak detector is charged up. Most, if not all, peak detectors have been unable to prevent the switching transistors from entering the saturation region thereby increasing the time required for the peak detector to respond to a new peak voltage level since a finite time is required to allow a saturated transistor to become active.

The speed at which the capacitor in the peak detector can be charged up is particularly important for rapidly changing input signals. A capacitor must charge up to the full peak voltage of the input signal level by the time the peak input level disappears or the true peak level will not have been recognized. Furthermore, the charge up time of a capacitor is related to the current through the capacitor by the following equation:

$$t_{cu} = (V_p \times C)/I \quad (1)$$

where $t_{cu}$ is the charge up time of the capacitor C;

$V_p$ is the peak voltage that we wish to obtain at the output; and

I is the current through the capacitor C.

Therefore, a quick charge up time ($t_{cu}$) requires a large current (I) thereby increasing the power dissipation of the peak detector. Most, if not all, peak detectors have satiated their required charge up time by simply increasing the power dissipation; however, if power dissipation is critical, compensation must result in an increased attack time.

Hence, what is needed is a peak detector that detects the positive peak voltage level of an input signal and having a quick attack time while minimizing power dissipation.

SUMMARY OF THE INVENTION

Accordingly, it is an object of the present invention to provide a peak detector circuit for detecting the positive peak voltage level of an input signal.

Another object of the present invention is to decrease the attack time of the peak detector circuit while minimizing power dissipation.

Yet another object of the present invention is to minimize the inaccuracies and offsets of positive peak voltage level detectors by abating the need for inverters.

In carrying out the above and other objects of the invention, there is provided a circuit having an output signal at an output which represents the most positive peak voltage level of an input signal applied at an input, comprising comparator circuit for comparing the voltage level of the input signal to the voltage level of the output signal for providing an output current at an output whenever the voltage level of the input signal exceeds that of the output signal; an amplification circuit responsive to the output current of the comparator circuit for amplifying the output current to charge a capacitive circuit to a voltage that is substantially equal to the most positive peak voltage level of the input signal; a buffer circuit to transform the voltage across the capacitor circuit to the output which further includes a clamping circuit for clamping the output of the comparator circuit to substantially the value of the output signal whenever the applied input signal is less than the output signal.

The above and other objects, features and advantages of the present invention will be better understood from the following detailed description taken in conjunction with the accompanying drawing.

BRIEF DESCRIPTION OF THE DRAWING

The sole FIGURE is a schematic diagram illustrating the preferred embodiment of the present invention.

DETAILED DESCRIPTION OF THE INVENTION

Referring to the sole FIGURE, there is illustrated a detailed schematic of the preferred embodiment of the present invention comprising comparator circuit which includes a pair of differentially connected transistors 10 and 12 having their emitters returned to ground reference by an independent current source 13, and their bases coupled to input terminal 14 and output terminal 16, respectively. The collector of transistor 10 is coupled to operating potential $V_{CC}$ while the collector of transistor 12 is coupled to operating potential $V_{CC}$ by independent current source 17 which is selected to supply precisely one half the current of independent current source 13 thereby minimizing any offset error.

Current amplification is provided by transistor 22 having a collector coupled to operating potential $V_{CC}$ a base coupled to the collector of transistor 12 of the comparator circuit, and an emitter coupled to ground reference by capacitive means comprising capacitor 24.

The present invention further comprises buffer circuit comprising a pair of differentially connected transistors 26 and 28 having their emitters coupled to ground reference by independent current source 30, and their bases coupled to the emitter of transistor 22 of the amplification circuit and to output terminal 16, respectively. The collector of transistor 26 is coupled to operating potential $V_{CC}$ while the collector of transistor 28 is coupled to operating potential $V_{CC}$ by independent current source 32, and to the base of transistor 34 which has a collector coupled to operating potential $V_{CC}$. Also, independent current source 32 is selected to supply precisely one half the current of independent current source 30 thereby minimizing any offset error. Furthermore, the emitter of transistor 34 is coupled to output terminal 16 by diode 20 and to the collector of transistor 12 of the comparator circuit by diode 18. It is understood that diodes 18 and 20 may be similarly formed by transistors having their bases and collectors shorted together. Finally, output terminal 16 is coupled to ground reference by independent current source 36 for biasing transistor 34 and diode 20.

For $V_{IN} > V_{OUT}$, signifying a new peak is present at input terminal 14, the present invention functions to produce an output signal that represents the positive peak voltage level of its input. In operation, all the current of independent current source 13 of value $I_T$ flows through transistor 10, while transistor 12 is off. Since transistor 12 is off, all the current of independent current source 17 of value $I_T/2$ flows into the base of transistor 22 thereby charging up capacitor 24 with an amplified current of $I_T/2$ multiplied by the beta or transistor 22. This allows both current sources, 17 and 13, to be very small and still supply significant current to charge up capacitor 24. Therefore, when comparing the charge time of the present invention to other peak detectors the present invention requires much less power to achieve the same charge up time thereby conserving an appreciable amount of power consumption. Furthermore, the present invention requires no inverters since it is designed to directly detect the most positive voltage level of the input signal thereby eliminating any offset errors due to the inverters.

The differential amplifier pair comprised of transistors 26 and 28 function as a buffer circuit to transform the voltage across capacitor 24 to output terminal 16 wherein the voltage across capacitor 24 denotes the positive peak voltage level at input terminal 14.

For $V_{in} < V_{OUT}$, whereby no peak signal is present at input terminal 14, the present invention functions to preserve the voltage across capacitor 24 at output terminal 16 via the buffer circuit which maintains the voltage at the base of transistor 26 equal to the voltage at the base of transistor 28, and to prevent transistor 12 from saturating. In operation, all the current of independent current source 13 of value $I_T$ flow through transistor 12 while transistor 10 is off. One half of the required $I_T$ current is obtained from independent current source 17, but if the other hal of $I_T$ is not provided from another source, transistor 12 will saturate. However, clamping means comprising diodes 18 and 209 provide a method to source the additional current of $I_T/2$ and prevent transistor 12 from ever saturating. The needed current of value $I_T/2$ is provided from the emitter of transistor 34, passed through diode 18 and injected at the collector of transistor 12. Furthermore, transistor 12 will never enter saturation since diodes 18 and 20 form a clamp to prevent the voltage at the collector of transistor 12 from falling below the voltage at the base of transistor 12. It is important to realize that the collector of transistor 12 is clamped to voltage $V_{OUT}$ while the base of transistor 26 is also maintained at $V_{OUT}$ by capacitor 24 which means that the base and emitter of transistor 22 is maintained at a voltage substantially equal to $V_{OUT}$ and, thus, transistor 22 is OFF. This is easily seen since the voltage at the emitter of transistor 34 will always be one diode voltage above the voltage at output terminal 16 while the voltage at the collector of transistor 12, when transistor 12 and diode 18 are on, will be one diode voltage below the voltage at the emitter of transistor 34. In other words, the voltage at the collector of transistor 12 will increase to a maximum value of the voltage at the base of transistor 12 thereby preventing transistor 12 from saturating. Therefore, since transistor 12 is never saturated, when $V_{IN}$ becomes greater than $V_{OUT}$ which signifies a new peak in the input signal, transistor 12 is ready to switch and a faster attack time is achieved.

By now it should be appreciated that there has been provided a novel peak detector circuit that successfully recognizes the most positive peak voltage level of an input signal while providing a fast attack time with minimum power requirements.

What is claimed is:

1. A circuit for providing an output signal at an output representing a most positive voltage level of an input signal applied at an input, comprising:
   comparator means having a first input coupled to the input and a second input coupled tot eh output of the circuit for providing a current at an output thereof whenever the voltage of said first input exceeds a voltage appearing at said second input;
   amplification means coupled to said output of said comparator means for amplifying said current of said comparator means;
   capacitive means responsive to said amplification means for charging to the most positive voltage level appearing at the input of the circuit; and
   buffer means coupled to said capacitive means for transforming a voltage developed across said capacitive means to the output of the circuit, said buffer means to a voltage substantially equal to a voltage appearing at the output of the circuit whenever the voltage level of the applied input signal is less than the voltage level of the output signal.

2. The circuit according to claim 1 wherein said comparator means includes:
   a first transistor having a collector coupled to a first supply voltage terminal, a base coupled to said first input of said comparator means, and an emitter;
   a second transistor having a collector coupled to said output of said comparator means, a base coupled to said second input of said comparator means, and an emitter coupled to said emitter of said first transistor of said comparator means;
   a first independent current source coupled between said emitters of said first and second transistors and a second supply voltage terminal;
   a second independent current source precisely one half the current of said first independent current source coupled between said first supply voltage terminal and said collector of said second transistor;

3. The circuit according to claim 2 wherein said amplification means includes:
   a transistor having a collector coupled to said first supply voltage terminal, base coupled to said output of said comparator means, and an emitter coupled to said capacitive means.

4. The circuit according to claim 3 wherein buffer means includes:
- a first transistor having a collector coupled to said first supply voltage terminal, a base coupled to said capacitive means, and an emitter;
- a second transistor having a collector, a base coupled to the output of the circuit and an emitter coupled to said emitter of said first transistor of said buffer means;
- a third transistor having a collector coupled to said first supply voltage terminal, base coupled to said collector of said second transistor of said buffer means, and an emitter coupled to the output of the circuit;
- a first independent current source coupled between said emitters of said first and second transistors of said buffer means and said second supply voltage terminal;
- a second independent current source for providing a current the magnitude of which is one half the current of said first independent current source of said buffer means and which is coupled between said first supply voltage terminal and said collector of said second transistor of said buffer means, 5. The circuit according to claim 4 wherein said clamping means of said buffer means includes:
- a first diode coupled between said emitter of said third transistor of said buffer means and the output of the circuit; and
- a second diode coupled between said emitter of said third transistor of said buffer means and said output of said comparator means.

6. The circuit according to claim 5 further includes:
- an independent current source coupled between the output of the circuit and said second supply voltage terminal.

7. A circuit for providing an output signal at an output terminal representing a most positive voltage level of an input signal applied at an input terminal, comprising:
- a first transistor having a collector coupled to a first supply voltage terminal, a base coupled to the input terminal, and an emitter;
- a second transistor having a collector, a base coupled to the output terminal, and an emitter coupled to said emitter of said first transistor;
- a third transistor having a collector coupled to said first supply voltage terminal, a base coupled to said collector of said second transistor, and an emitter;
- a fourth transistor having a collector coupled to said first supply voltage terminal, a base coupled to said emitter of said third transistor, and an emitter;
- a fifth transistor having a collector, a base coupled to the output terminal, and an emitter coupled to said emitter of said fourth transistor,
- a sixth transistor having a collector coupled to said first supply voltage terminal, a base coupled to said collector of said fifth transistor, and an emitter;
- a first independent current source coupled between said emitters of said first and second transistors and a second supply voltage terminal;
- a second independent current source precisely one half the current of said first independent current source coupled between said first supply voltage terminal and said collector of said second transistor;
- capacitive means coupled between said emitter of said third transistor and said second supply voltage terminal for charging to the most positive voltage level applied at the input signal;
- a third independent current source between said emitters of said fourth and fifth transistors and said second supply voltage terminal;
- a fourth independent current source precisely one half the current of said third independent current source coupled between said first supply voltage terminal and said collector of said fifth transistor; and
- first and second diode means for preventing said second transistor from saturating where said first diode means is coupled between said emitter of said sixth transistor and the output terminal and said second diode means is coupled between said emitter of said sixth transistor and said collector of said second transistor.

8. The circuit according to claim 7 further includes:
- a fifth independent current source coupled between the output terminal and said second supply voltage terminal.

* * * * *